United States Patent
Brennan

(10) Patent No.: US 6,711,721 B2
(45) Date of Patent: Mar. 23, 2004

(54) METHOD FOR ADDING REDUNDANT VIAS ON VLSI CHIPS

(75) Inventor: Thomas Charles Brennan, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/346,006

(22) Filed: Jan. 16, 2003

(65) Prior Publication Data
US 2003/0106028 A1 Jun. 5, 2003

Related U.S. Application Data

(62) Division of application No. 09/954,791, filed on Sep. 17, 2001, now Pat. No. 6,556,658.

(51) Int. Cl.⁷ .............................................. G06F 17/10
(52) U.S. Cl. .................................................. 716/2
(58) Field of Search .................................. 716/1, 2, 6

(56) References Cited

U.S. PATENT DOCUMENTS

| | | | | |
|---|---|---|---|---|
| 5,798,937 | A | * | 8/1998 | Bracha et al. ................... 716/9 |
| 5,901,065 | A | * | 5/1999 | Guruswamy et al. .......... 716/8 |
| 6,026,224 | A | * | 2/2000 | Darden et al. ................. 716/10 |
| 6,247,853 | B1 | * | 6/2001 | Papadopoulou et al. ....... 716/4 |
| 6,317,859 | B1 | * | 11/2001 | Papadopoulou ................ 716/4 |
| 6,463,570 | B1 | * | 10/2002 | Dunn et al. ..................... 716/4 |
| 6,502,230 | B1 | * | 12/2002 | Graef et al. .................... 716/14 |
| 6,507,930 | B1 | * | 1/2003 | Bass et al. ...................... 716/2 |
| 6,532,581 | B1 | * | 3/2003 | Toyonaga et al. ............. 716/11 |

OTHER PUBLICATIONS

H. Reiter et al., "Bad Vias are the Cause for Electrical Test Yield Losses After Plastic Chip Assembly," Sep. 1998, SPIE vol. 3510, pp. 194–202.

IBM TDB 06–85, Bossen et al., "Yield and Reliability Enhancement Via Redundancy for VLSI Chips and Wafers," pp. 36–42, http://itirc.ibm.com:1205/SESS716901/GET-DOC/63/4/3.

D. Dreibelbis et al., "The Hidden Benefits of IBM ASICs." Micro News, Fourth Quarter 2000, vol. 6, No. 4, http://www.chips.ibm.com/micronews/vol6_no4/dreibelbis.html.

K. Barkley et al., "Design for Manufacturing/Yield—Redundant Via/Contact Insertion Tool," IC SIG Abstracts, http://www.cadenceusers.org/sanjosc/abstracts/IC.html.

* cited by examiner

Primary Examiner—Stacy A. Whitmore
(74) Attorney, Agent, or Firm—Robert R. Williams

(57) ABSTRACT

A method is shown which replaces single vias with redundant vias on candidate signals on a semiconductor integrated circuit chip. Where limited space prevents such replacement on more than one signal wire, the method assigns priority to the via through which more current must flow to charge or discharge capacitance. This prioritization reduces the magnitude of delay anomalies arising from vias containing process related resistance defects.

6 Claims, 10 Drawing Sheets

METHOD FOR ADDING REDUNDANT VIAS ON VLSI CHIPS

REFERENCE TO PARENT APPLICATION

This application is a divisional of U.S. Ser. No. 09/954,791, filed on Sep. 17, 2001 now U.S. Pat. No. 6,556,658, by Thomas Charles Brennan, and entitled "Method for Adding Redundant Vias on VLSI Chips", which is hereby incorporated by reference.

FIELD OF THE INVENTION

This invention relates to integrated circuit chips, and, in particular, to enhancement of reliability of the chip by adding redundant vias.

DESCRIPTION OF THE RELATED ART

An integrated circuit chip comprises a number of active transistors, and perhaps resistors, capacitors, and inductors. These components are electrically coupled by interconnection conductors, or wires, to create a desired function on the chip.

In the early days of semiconductor chips, the interconnection was usually accomplished on two layers of wiring. Aluminum or aluminum alloy was often used for the wiring metallurgy. Interlevel conductors, called vias, were used to electrically couple a signal on one wiring layer to another wiring layer. On the chip, one layer of wiring would predominantly have wires going horizontally when looking down on the chip; the other layer of wiring would predominantly have wires going vertically. For example, if an interconnection required that a signal be routed vertically 100 units and horizontally 45 units, a routing program or a graphics technician would route the signal 100 units on a layer predominantly used for vertical wiring, and 45 units on a second layer which was devoted primarily to horizontal wiring. The program or technician would complete the electrical path by placing a via at the intersection where the signal wire on the upper wiring layer is physically under the signal wire on the lower layer of wiring.

Modern semiconductor chip technology has advanced significantly, and many chips have six or more layers of wiring. Vias are still used to couple signal wire portions on different layers of wiring. Modern chips can easily have over 400,000 signals and over 4,000,000 vias to interconnect the circuits.

Vias are physically very small, the area of a via being limited to the area defined by the conjunction of the signal wiring shapes on the two layers. For example, if the signal wires are 0.5 microns wide, a via would be 0.5 micron wide by 0.5 micron high, at most. In practice, the via might be smaller yet to allow for misregistration of the via on the signal wires, or to allow for other process tolerances. The extremely small size of the vias increases the probability, given normal process defect densities and tolerances, that some of the vias on the chip have defects, and may be much more resistive than would be expected.

Delays in signals on the chip are introduced when the signal wiring is resistive or has resistive portions. A logic circuit driving the signal must charge or discharge some amount of capacitance to bring the signal to a valid logic level. A resistance in series with the signal path limits the current available to charge or discharge the capacitor. Capacitance that must be charged or discharged is accurately calculated by available design automation tools, which examine the signal wires for parasitic capacitance to other signal wires and to supply voltage wires. In addition, inputs of logic circuits driven are, in general, capacitive. Many design automation tools calculate delays for expected resistance and capacitance elements of the signal wiring, including expected resistance of vias. However, an unexpectedly large resistance will invalidate the delay number calculated. Invalid delays caused by process defects will often, but not always, be detected during normal chip testing procedures. If detected, the chip will be rejected, decreasing the yield of the fabrication process. If not detected, faulty operation of the product in the customer's office could occur.

Delay caused by a resistance is largely dependent upon how much capacitance must be charged by current that must flow through the resistor. Many sophisticated techniques are used to calculate, with varying degrees of accuracy, the delay caused by a resistor. For purposes of explanation, a very simple approximation is that the delay caused by a resistor is equal to the value of the resistor times the total capacitance that must be driven through the resistor. This approximation becomes "exact" if a linear voltage is applied at a first side of the resistor and continues ramping forever. The voltage at a second side of the resistor will, after initial transients, be delayed from the voltage at the first side by the resistor value times the value of a capacitor on the second side of the resistor. In practice, for modern logic chips, the approximation's accuracy is limited, but will serve for exemplary purposes.

A signal path will consist of a number of resistive elements and distributed capacitance. The signal may also branch into two or more paths that must be driven. Clearly, resistors near the driver have more capacitance that must be charged through them than a resistor at the end of the signal wire, through which current needs only to charge a small capacitance. Delay calculation error will thus be much larger if an unexpectedly large resistance is introduced near the driver than at the end of the signal.

Some design systems or graphics technicians will, after normal wiring is complete, add redundant vias, where possible, to enhance yield. Expanding some shapes on the signal wire and replacing a single, small via with a larger via, or adding a second via, creates a redundant via. In this invention, a larger via is equivalent to a redundant via. In most designs, wiring areas have a large percentage of available wiring space used by signals, leaving only a portion of the space for such redundant vias. Therefore, not all vias can be made redundant. Yield, therefore, suffers as one or more defective vias are resistive enough to create negative timing margins, or the defective vias are even totally nonconductive.

In many high performance designs, not all signals are candidates for receiving redundant vias. Clock signals, for example, are finely tuned for delay and skew. Addition of redundant vias adds a small amount of capacitance to the signal, which is intolerable on a clock signal. Some signals have insufficient timing margin, and also cannot tolerate the added capacitance of redundant vias.

Present design automation systems do not prioritize creation of redundant vias based on consideration of capacitance that must be driven through the vias.

Therefore, a need exists to provide a method that prioritizes creation of redundant vias on semiconductor integrated circuit chips based on the amount of capacitance that must be driven through the vias.

SUMMARY OF THE INVENTION

The present invention provides a method to increase yield of semiconductor chips by selection of candidate signals capable of having redundant vias added, and prioritizing creation of redundant vias based on the capacitance that must be driven through the vias.

The method of the present invention first eliminates all clock signals from candidacy for replacement of single vias by redundant vias.

The method of the present invention further eliminates all signals with no timing margin or less than a predetermined amount of small timing margin from candidacy for replacement of single vias by redundant vias.

In one embodiment of the present invention, a simple numbering of vias from the drivers on the signals to the receivers is performed. For example, starting at the driver end of each signal wire, the first via encountered would be assigned a "1"; the second would be assigned a "2", and so on. This would be performed for all signals not eliminated in the first two steps. Upon completion of such numbering, an attempt is made to replace single vias with redundant vias. Where space does not allow replacement of a single via by a redundant via on more than one signal, priority is given to the single via with the lowest assigned number. Obviously, the number given the first via is arbitrary, and could be 0, for example, rather than 1. Furthermore, incrementing need not be by 1. Any numbering scheme indicative of how many vias separate an instant via from the driver is anticipated by this invention.

In another embodiment of the present invention, each via on candidate signals is assigned a value indicative of the total capacitance that must be charged with current flowing through the via. Upon completion of such assignment, an attempt is made to replace single vias with redundant vias. Where space does not allow creation of a redundant via on more than one signal, priority is given to the single via with the largest capacitance that must be charged by current flowing through the single via.

BRIEF DESCRIPTION OF THE DRAWINGS

In FIG. 6 there is only one physically possible place for a redundant via connection for the two signals.

DETAILED DESCRIPTION OF THE PREFERRED EMBODIMENTS

Figure 1:
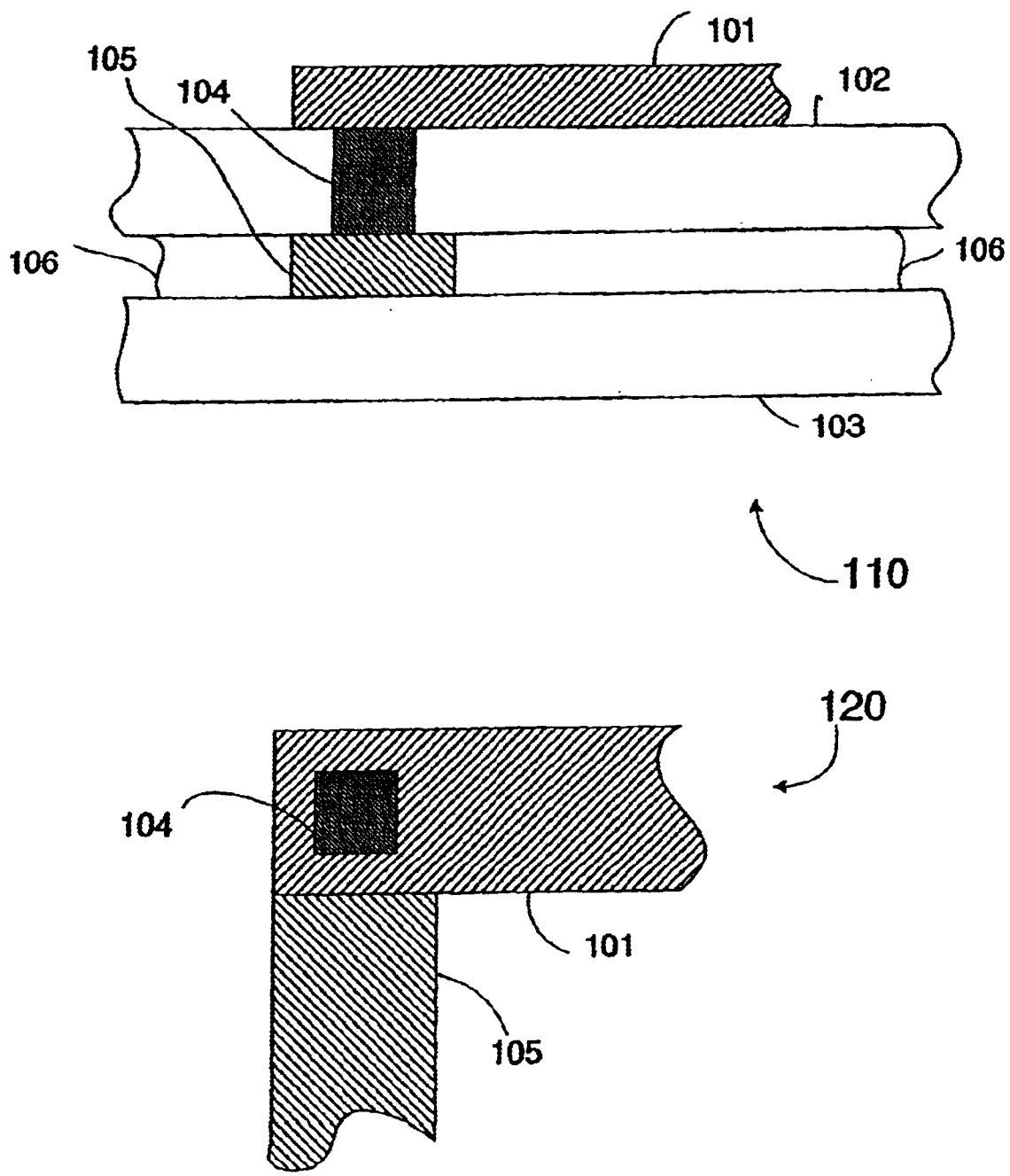
FIG. 1 shows a top view and a side view of a conventional single via completing an electrical coupling between a signal wire on one wiring level and the signal wire on a second wiring level.

Having reference now to FIG. 1, a side view 110 and a top view 120 show a conventional single via 104 electrically coupling a first portion of a signal wire 101 on a first wiring level to a second portion of the signal wire 105 on a second wiring level. Electrical resistance of such a via is typically 0.1 ohm to approximately 10 ohms, depending on the process used and tolerances in the process. Via 104 is shown to be smaller than the area, or conjunction, of signal wire 101 overlapping signal wire 105. In practice, the size of vias could be even smaller, or could be as large as the entire conjunction, or intersection, of the two signal wiring portions 101 and 105, depending on the requirements of a particular process.

Interlevel dielectric 102 is a nonconducting material, such as silicon dioxide, which separates and electrically isolates wires on one level from wires on a second level.

Another interlevel dielectric 103 separates and electrically isolates wire on the lower wiring level from wires or other components on yet another wiring level, or circuit level below. Modern semiconductor chips can have six or more of such wiring levels.

Insulator 106 shows additional insulating material that is used to occupy the space between the interlevel dielectrics 102 and 103 in places where there is no signal wire.

Figure 2:
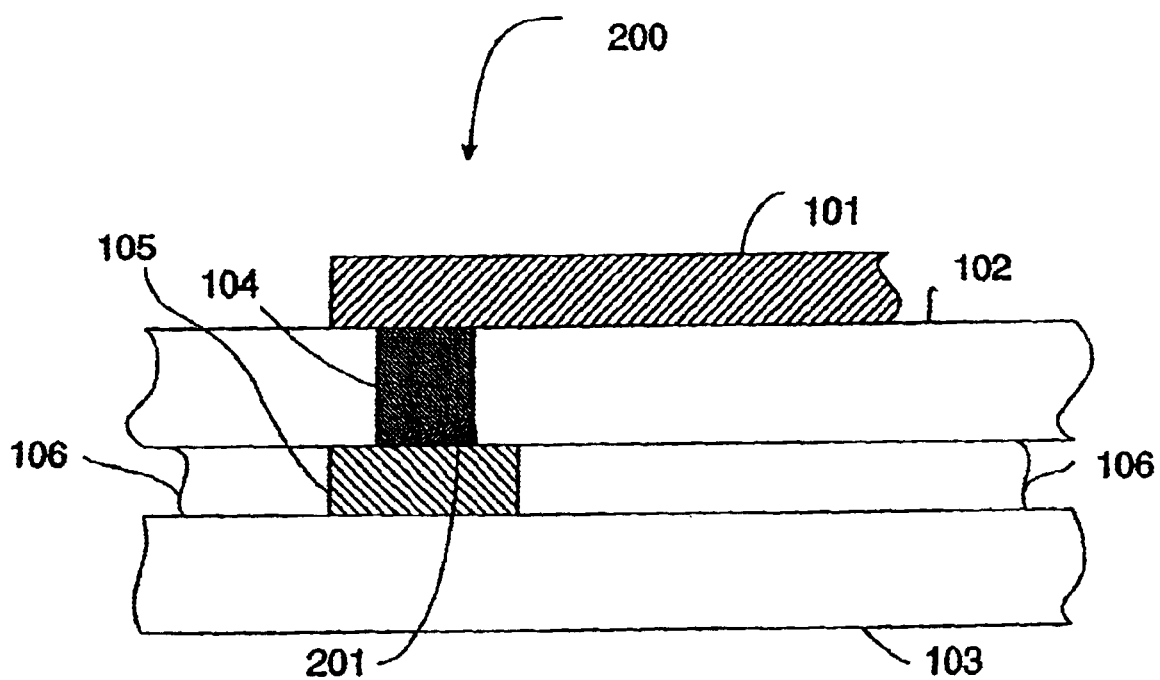
FIG. 2 shows a side view of the conventional single via structure of FIG. 1, further showing a manufacturing defect that will cause the via structure to have a much larger resistance than expected.

FIG. 2 shows a side view 200 of a wiring structure similar to that shown in side view 110 in FIG. 1. Further shown in side view 200 is a manufacturing defect 201. As shown, manufacturing defect 201 is an area of nonconducting, or poorly conducting, substance in a portion of the volume of via 104. Such a defect 201 could be a thin oxide residue resulting from an improper via etch process. Other such defects have been reported in the literature, and are contemplated by this invention. Defect 201 could have a large effect on the resistance of via 104, causing the resistance of via 104 to be hundreds of ohms, thousands of ohms, or even be a nonconductor. Even though the probability of a defect 201 existing on a given via 104 is very low, there are millions of via 104 structures on a typical modern semiconductor chip. The probability of at least one via 104 with defect 201 existing on a modern semiconductor chip is significant. Chips that have at least one via 104 with defect 201 which causes via 104 to be completely nonconducting are discarded, lowering the yield of the semiconductor process. Some chips will have at least one via 104 with defect 201 causing a higher resistance for via 104 than would be expected. Some magnitude of delay anomaly will result from the unexpected resistance. This delay anomaly may or may not be detectable in normal manufacturing testing of the chip. If not detected during testing of the chip, the anomaly may result in faulty operation of the chip in a customer's office.

Figure 3:
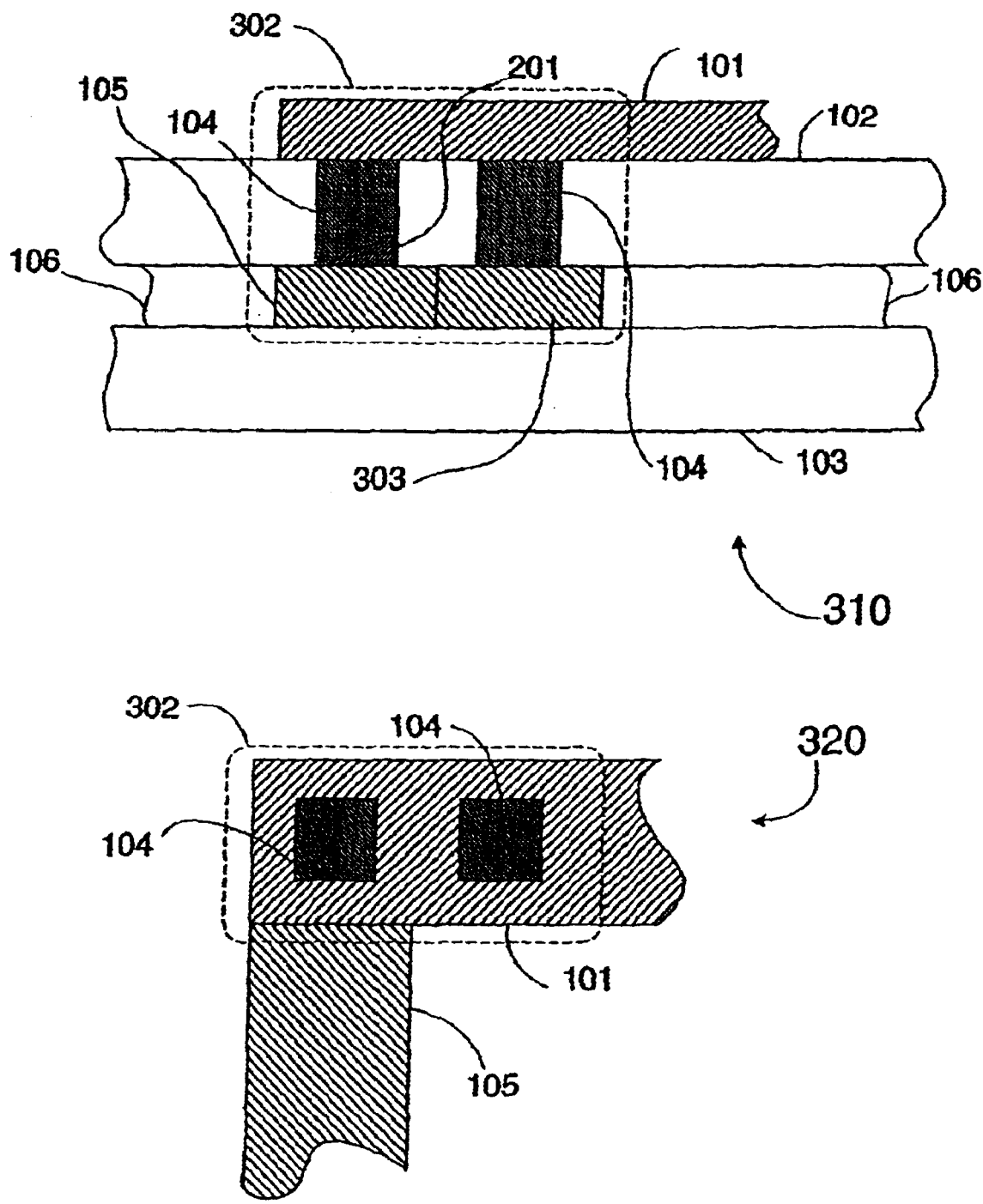
FIG. 3 shows a top view and a side view of a redundant via completing an electrical coupling between a signal wire on one wiring level and the signal wire on a second level. A manufacturing defect is shown on one of the two vias.

FIG. 3 shows a side view 310 and a top view 320 of a chip wiring scenario, depicting a redundant via 302 comprising two vias 104. Manufacturing defect 201 is shown in the leftmost via 104. The signal wire portion 105 on the lower level must have an orthogonal extension 303 added in order to have a larger conjunction with the signal wire portion 101, thereby creating enough intersection area to allow the second instance of via 104. Creation of the second via 104 virtually eliminates the possibility of a random defect 201 invalidating the timing of the signal at this redundant via, because defect 201 is a rare event, and having two simultaneous rare events on the same redundant via 302 is highly unlikely.

Figure 4:
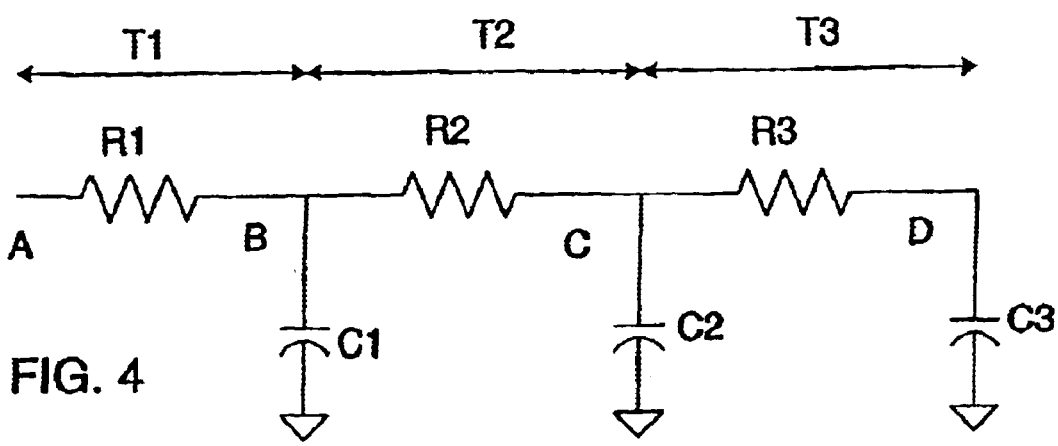
FIG. 4 shows a distributed resistor-capacitor (RC) electrical network that will be used to describe timing effects of such a network.

FIG. 4 depicts a distributed resistor-capacitor network. Signal paths are frequently electrically described by such a network. A driver is usually coupled to node A; a receiver is commonly coupled to node D; nodes B and C are intermediate nodes. Resistors R1, R2, and R3 represent resistance in the signal wires, resistance in vias on the signal path, or a combination thereof. Such electrical models commonly comprise many such resistors, perhaps over 100 resistors. C1, C2, and C3 represent capacitance associated with the signal wire, capacitance of vias, and input capacitance of circuits driven by the signal. A complicated signal might require over 100 capacitors to accurately model the signal path. A signal is delayed by the resistors and capacitors as the signal travels along the signal path. Capacitors must be charged and discharged by electrical current. The resistors limit electrical current, delaying the charging and discharging of the capacitors. T1, T2, and T3 represent delays from node A to B, node B to C, and node C to D, respectively. The more total capacitance that must be charged through a resistance, the more delay there is through the resistor.

Figure 5:
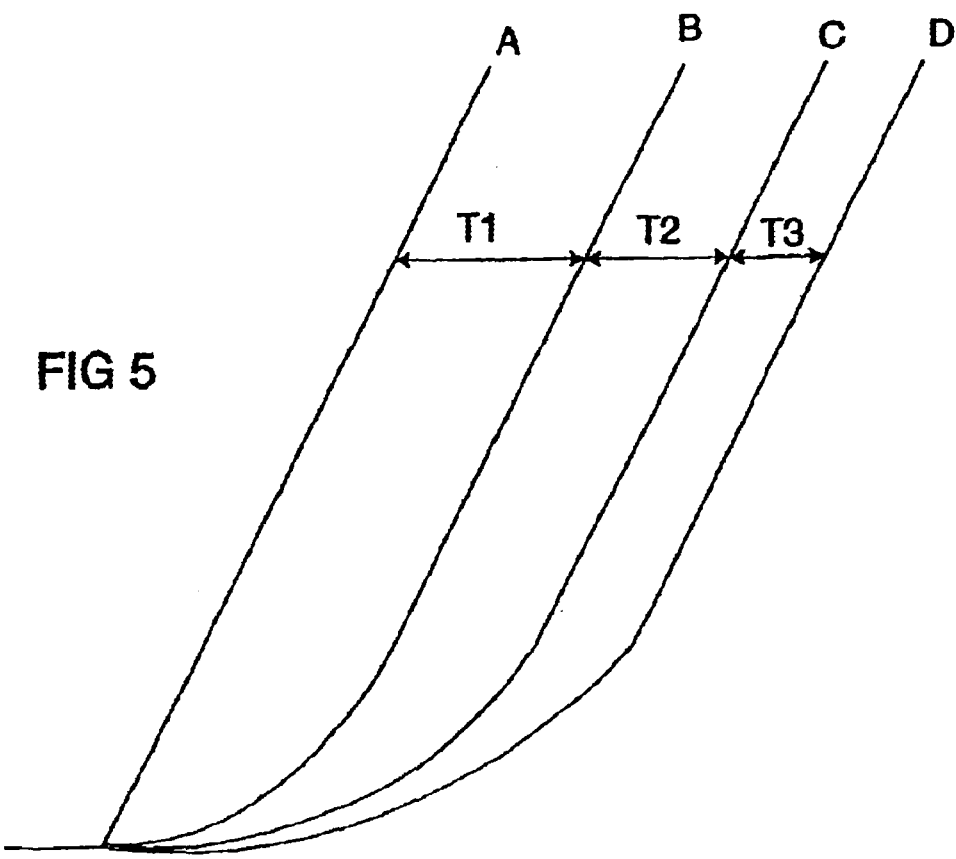
FIG. 5 shows electrical voltage waveforms that will occur on the nodes of the RC network shown in FIG. 4 as a linear ramp is applied at the leftmost node.

FIG. 5 shows waveforms representative of node voltages in the network shown in FIG. 4. If a linear voltage ramp is placed on node A, node B will follow node A by a time T1=R1*(C1+C2+C3) after transients have disappeared. Node C will follow node B by a time T2=R2*(C2+C3), again, after transients have disappeared. Finally, node D will follow node C by T3=R3*C3 after transients have disappeared. In practice, these estimates for T1, T2, and T3 are only approximations. For example, the node voltage at A is not, in practice, a linear ramp, and will stop rising at some voltage. Better estimates for these delays exist in the literature. However, the estimates serve as approximations, and in practice, delays will increase for a resistor as the resistor value increases. Furthermore, larger delay anomalies will occur if a larger capacitance must be charged through a unexpectedly high resistance than if a smaller capacitance must be charged through the unexpectedly high resistance.

From the above discussion, it is more important to eliminate resistance anomalies on vias that are nearer to a driver than vias that are nearer to a receiver. Stated another way, it is more important to eliminate resistance anomalies on vias through which more current must pass to charge a larger amount of capacitance.

Figure 6:
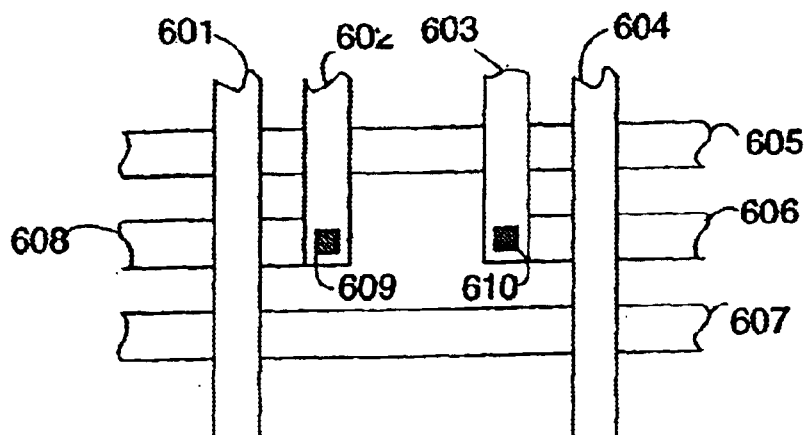
FIG. 6 shows a top view of two levels of signal wiring, with two of the signal wires running vertically on a top level shown being connected by single vias to signal wires on a second level running horizontally.

FIG. 6 shows a wiring scenario where area exists to make one redundant via, but wherein two single vias are competing for the space required to replace them with redundant vias. Signal wires 601, 602, 603, and 604 are depicted running vertically on a top wiring level. Signal wires 605, 606, 607, and 608 are shown running horizontally on a bottom wiring level. In the example of FIG. 6, signal wire 602 is electrically coupled to signal wire 608 by via 609; signal wire 603 is electrically coupled to signal wire 606 by via 610. Wires 605 and 607 block expansion of wires 608 and 606 in a vertical direction on the bottom wiring level. Similarly, wire 601 blocks wire 602 from expanding to the left. Wire 604 blocks wire 603 from expanding to the right.

Figure 7:
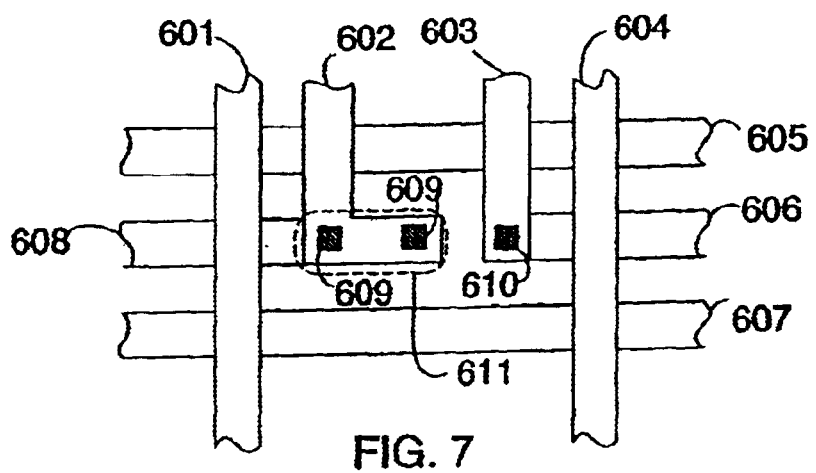
FIG. 7 shows the one physically possible place for a redundant via, as described above, being used for a redundant via connection of the leftmost of the two signal wires that require an interlevel coupling.

FIG. 7 shows the wiring scenario of FIG. 6 but with a redundant via 611 provided to couple wire 602 with wire 608. Wire 602 has been expanded to the right on the top wiring level, and wire 608 has been extended to the right on the bottom wiring level. A second via 609 has been added, thus creating the redundant via 611.

Figure 8:
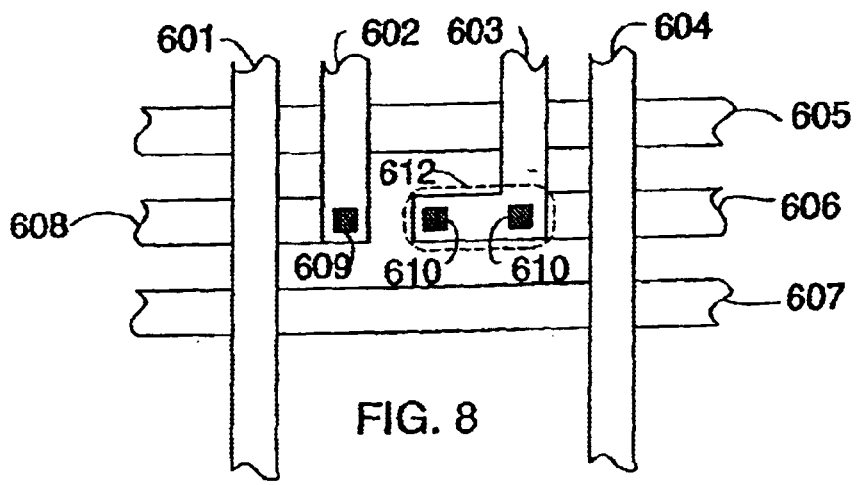
FIG. 8 shows the one physically possible place for a redundant via, as described above, being used for a redundant via coupling of the rightmost of the two signal wires FIG. 9a and FIG. 9b collectively show a flow chart used to illustrate a method used to assign priority to one signal over another when competition for space for a redundant via occurs.

FIG. 8 shows the wiring scenario of FIG. 6 but with a redundant via 612 provided to couple wire 603 with wire 606. Wire 603 has been expanded to the left on the top wiring level, and wire 606 has been extended to the left on the bottom wiring level. A second via 610 has been added, thus creating the redundant via 612.

The examples of FIG. 7 and FIG. 8 illustrate a common situation where it is desirable to create a redundant via for more than one signal, but wiring congestion prevents the creation of more than one redundant via. A method of prioritizing which signal to create a redundant via for will now be described in detail.

Figure 9A:
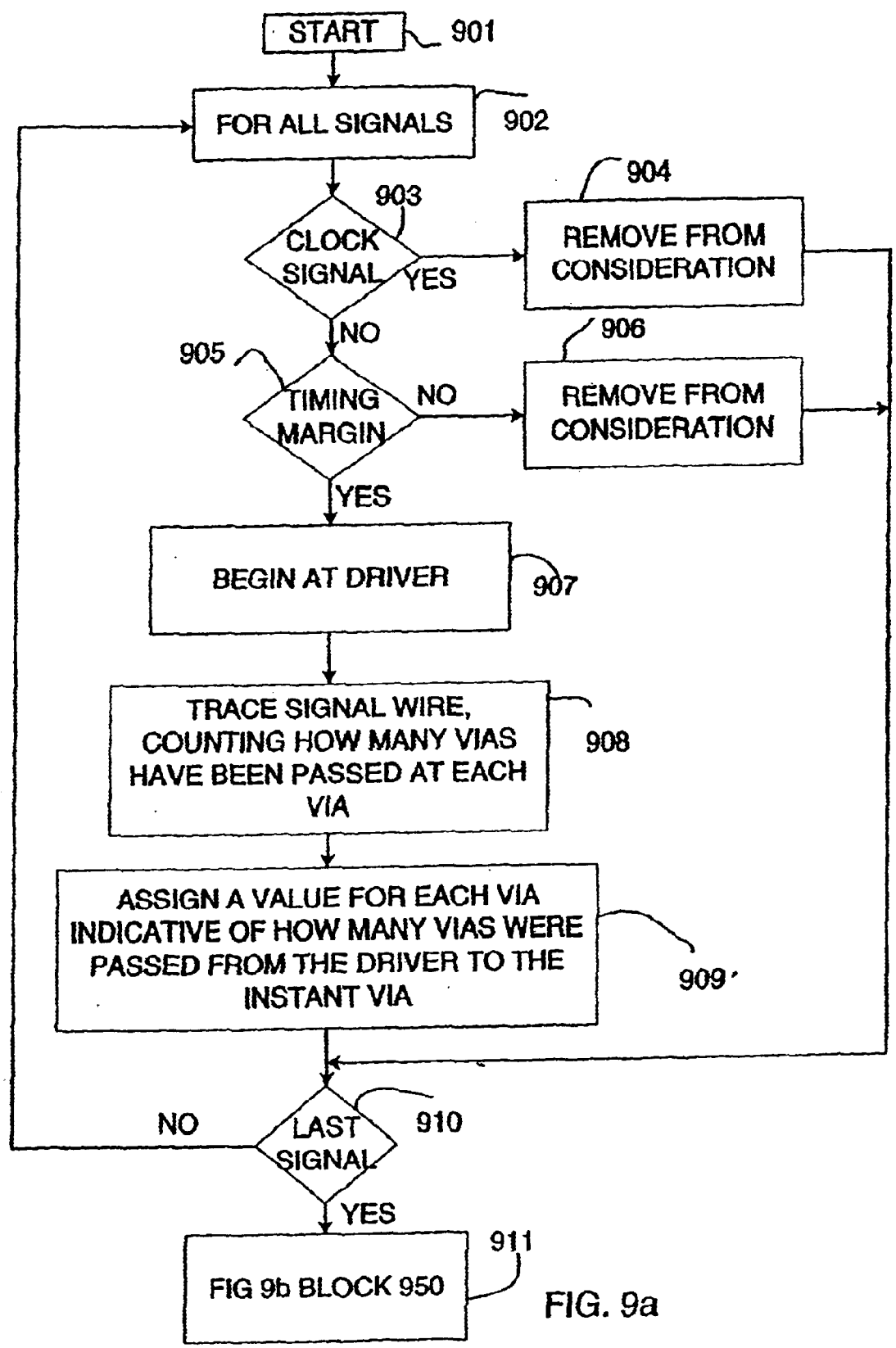
Figure 9B:
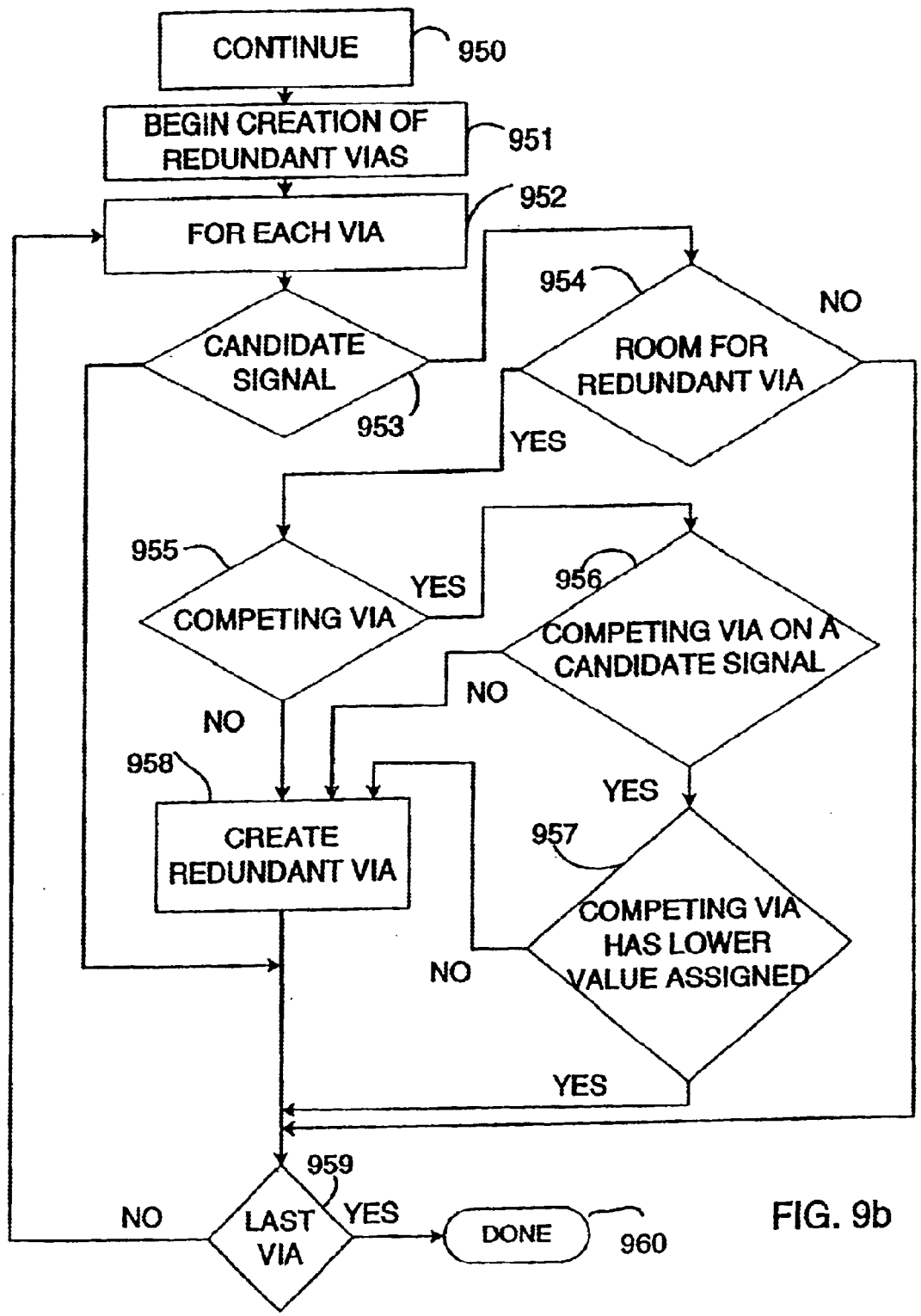

FIGS. 9a and 9b together describe an embodiment of the method wherein redundant via priority in the case of a conflict is assigned simply to the competing single via that has fewer vias between that via and the driver which drives the signal that via is on. In the case where the number of vias is the same, the first one to be considered is granted priority.

Block 901 in FIG. 9a is the start of the method.

Block 902 begins a process loop, which iterates through all signals on the chip. Each time block 902 is entered, a new signal is considered during the loop.

Block 903 checks to see if the instant signal is a clock signal. Clock signals are finely tuned, and even the very small added capacitance of a redundant via would add unwanted skew to the clock signal versus other clock signals. If the instant signal is a clock signal, control passes to block 904. If the instant net is not a clock signal, control is passed to block 905. Block 905 checks whether timing margin exists on the signal. If no timing margin exists, or the timing margin is less than a predetermined amount, control passes to block 906. Addition of the small amount of capacitance of a redundant via would create negative timing margin. If timing margin is greater than the predetermined amount, control passes to block 907. Block 907 begins a trace of the signal wire starting at the driver. Block 908 traces the signal wire, keeping track of the number of vias that have been traversed during the trace. Block 909 assigns a number to each via that is indicative of how many vias were traversed between the driver on the signal and the instant via.

Block 910 ends the loop through all signals, passing control back to block 902 if there are more signals to consider, and passing control to block 911 if all signals have been considered. Block 911 is a connector that simply passes control to connector block 950 in FIG. 9*b*.

Block 951 in FIG. 9*b* begins the process control that resolves priority conflicts and creates redundant vias.

Block 952 begins a loop in which each single via on the chip is considered for creation of a redundant via. A different single via is selected each time block 952 is entered. It will be assumed that only single vias are to be considered for replacement by redundant vias. Should a graphics technician or a design automation have already created a redundant via, there is no reason to add further redundancy.

Block 953 checks whether the instant via is on a candidate signal. Clock signals and signals with insufficient timing margin were removed from candidacy in blocks 903, 904, 905, and 906 in FIG. 9*a*. The processing of blocks 903, 904, 905, and 906 could optionally be performed in block 953; however, some computer time would be wasted in blocks 907, 908, and 909, processing tracing and via counting on signals for which none of the vias can be candidates. If block 953 determines that the instant via is not on a candidate signal, control is passed to block 959. If block 953 determines that the instant via is on a candidate signal, control is passed to block 954.

Block 954 determines if space exists to place a redundant via. If space does not exist, control passes to block 959. If space exists for a redundant via, control passes to block 955.

Block 955 determines if another via is competing for the space. If no via is competing for the space, then control passes to block 958. If another via is found to compete for the same space, control is passed to block 956.

Block 956 determines if the competing via is on a candidate signal. If it is not on a candidate signal, control passes to block 958. If the competing via is on a candidate signal, control passes to block 957.

Block 957 compares the value assigned to the instant via at block 909 in FIG. 9*a* with the corresponding value of the competing via. If the competing via has a lower value assigned, the instant via has a lower priority, and control is passed to block 959. If the competing via has an equal or larger value assigned, control is passed to block 958. The case of equal priority is handled in block 957 by giving priority to the instant via. Although assigning priority to the competing via when the values assigned are equal is contemplated in this invention, the preferred method is as specified in block 957, which reduces processing time and complexity when the competing via is selected by block 952.

Block 958 replaces the instant via with a redundant via. Creation of the redundant via also removes the space required for the redundant via from availability for creation of other redundant vias.

Block 959 determines if the instant via is the last via to be considered. If not, control passes to block 952. If the instant via is the last via to be considered, control passes to block 960, which is the termination of the process of creating redundant vias.

Figure 11:
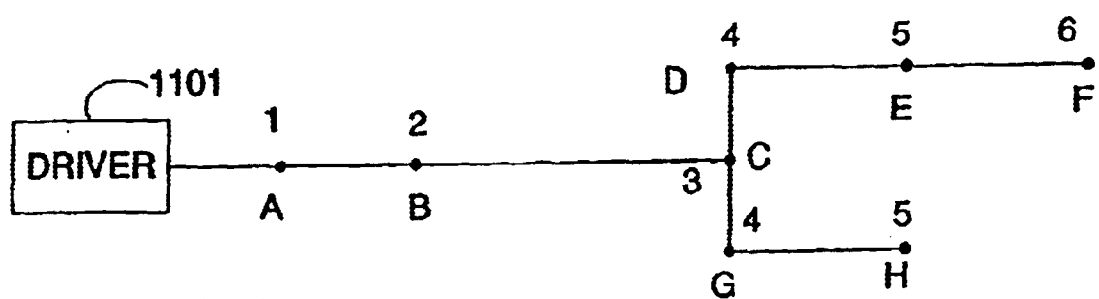
FIG. 11 shows a schematic of a driver and a signal network, with an example of via value assignments as taught by the method of FIG. 9a and FIG. 9b.

FIG. 11 shows a schematic of a driver and a signal path, with the vias assigned according to the method detailed in FIG. 9*a* and FIG. 9*b*. Driver 1101 drives the signal to its logical voltage level, according to a specification of the particular technology. Via A is the first via encountered and is therefore assigned a value of "1". Via B is the second via encountered, and is therefore assigned a value of "2". Via C is similarly assigned a value of "3". A branch in the signal path is shown occurring at via C. Via D, Via E, and Via F, respectively, are assigned values of "4", "5", and "6". On the other branch of the signal, via G and via H are assigned values of "4" and "5", respectively.

Obvious variations of this procedure are contemplated by this invention. Such variations would include accumulating the total number of vias "to the right" of each instant via in FIG. 11, and assigning that value to the instant via. Vias A, B, C, D, E, F, G, and H would have values of 7, 6, 5, 2, 1, 0, 1, and 0 in such a variant of the embodiment. Block 957 would then be modified to pass control to block 958 if the instant via had a value equal to or larger than the competing via, or otherwise to block 959. As with the discussion above, the actual numbering scheme is arbitrary, and the intention is to assign each via a value indicative of the number of vias that are further from the driver than the instant via.

Figure 10A:
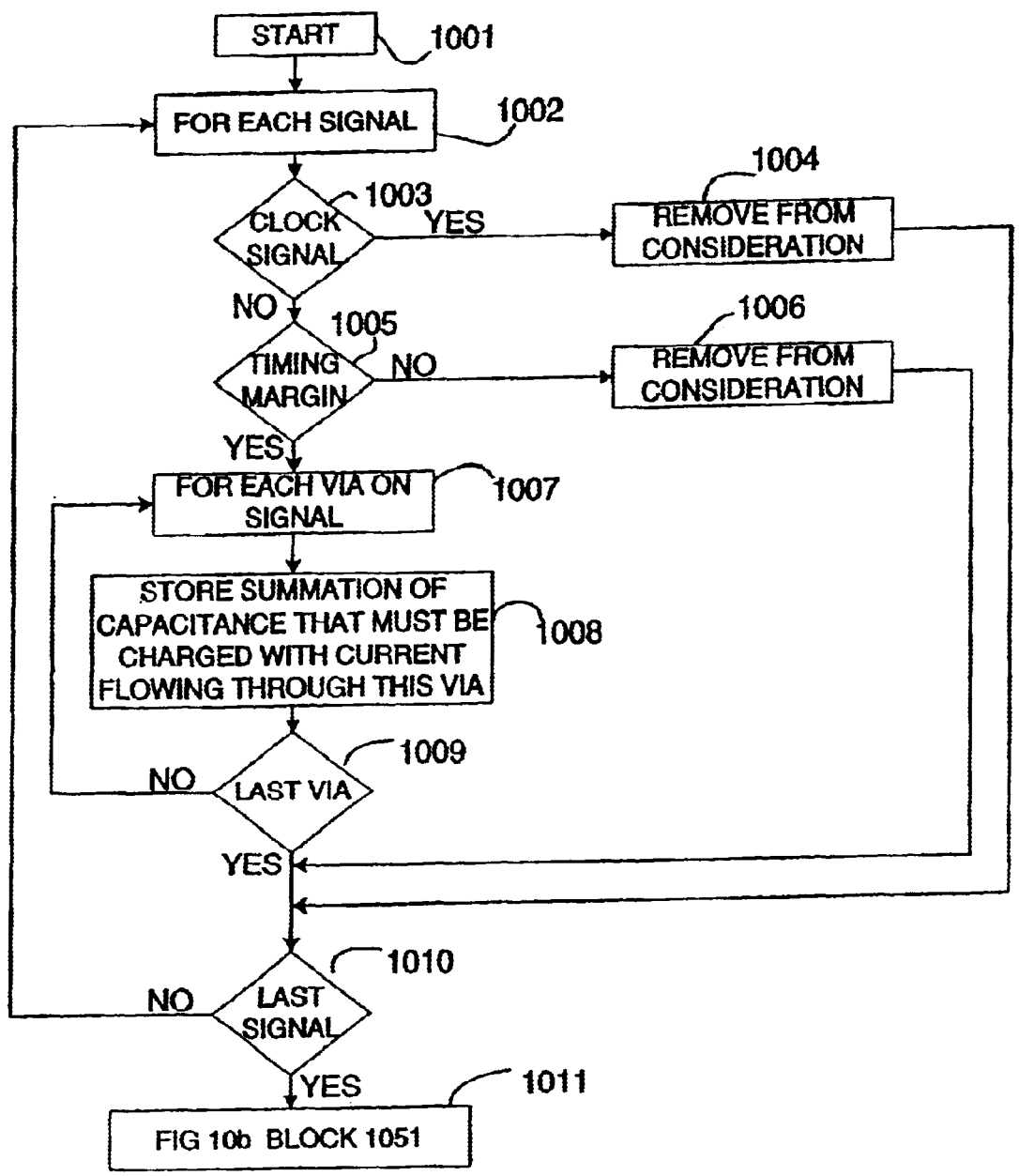
FIG. 10a and FIG. 10b collectively show a flow chart used to illustrate a second method used to assign priority to one signal over another when competition for space for a redundant via occurs.
Figure 10B:
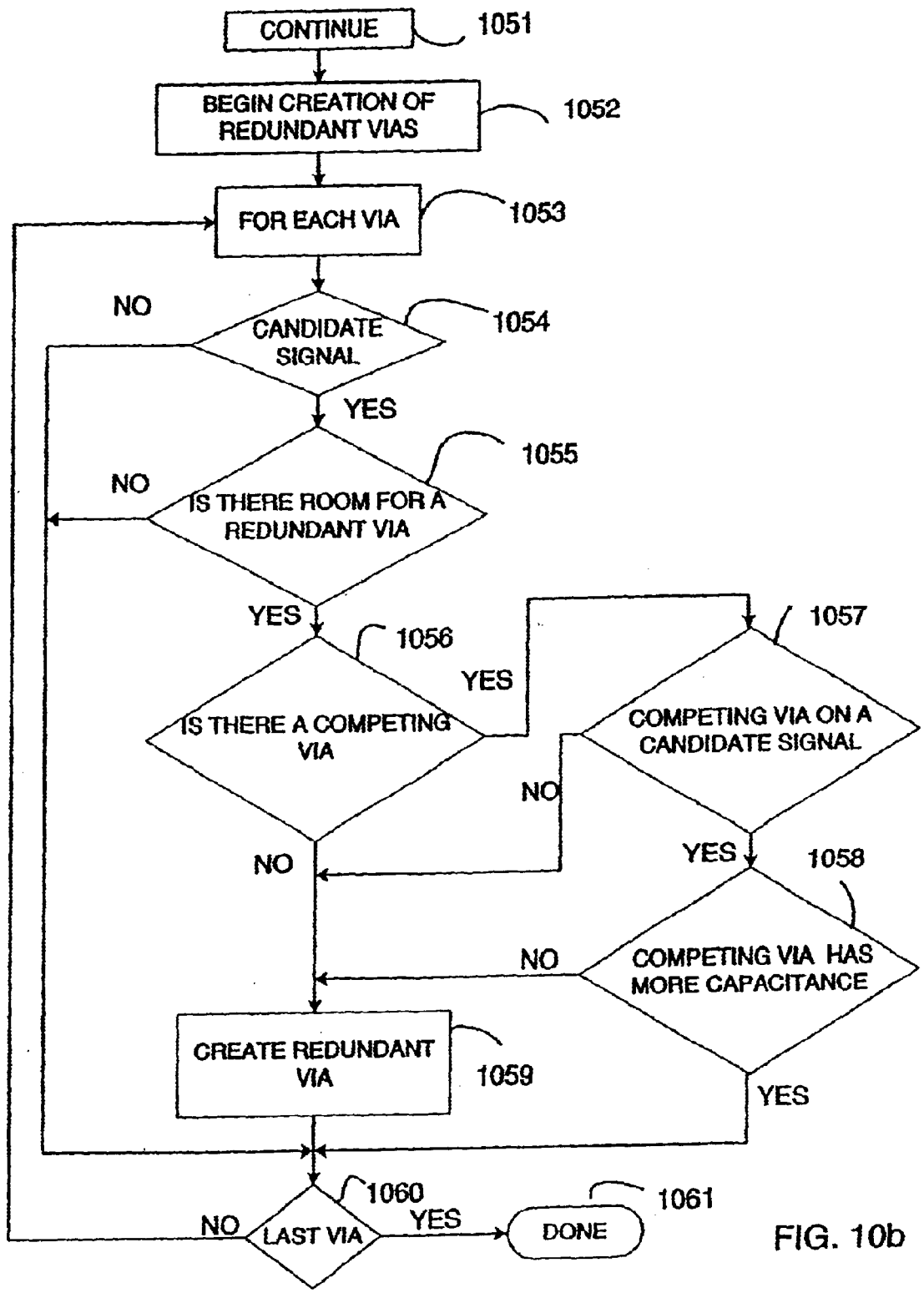

FIG. 10*a* and FIG. 10*b* collectively show a more sophisticated method embodiment than is shown in FIG. 9*a* and FIG. 9*b*. As will be described in detail below, rather than prioritizing based on a simple count of number of vias from the driver, the method described now will grant priority for creation of a redundant via to the single via among competing single vias that has the largest capacitance that must be charged with current passing through the via.

Block 1001 in FIG. 10*a* is the start of the method.

Block 1002 begins a loop wherein a different signal is considered selected each time block 1002 is entered.

Blocks 1003, 1004, 1005, and 1006 remove signals from consideration exactly as blocks 903, 904, 905, and 906 removed signals in FIG. 9*a*. Clock signals and signals with timing margins less than a predetermined amount are removed from consideration as candidates for redundant vias. Control passes to block 1010 if the instant signal is removed from consideration. If the signal is not removed from consideration, control passes to block 1007.

Block 1007 begins a loop through all vias on the instant signal. Block 1008 determines the capacitance that must be charged by current passing through the instant via, and storing said capacitance as a value associated with the instant via. Storing a value indicative of a magnitude of said capacitance, or proportional to said capacitance is contemplated by this invention, instead of the actual capacitance.

Block 1009 determines if the instant via is the last on the signal; if so, control passes to block 1010; if not, control passes to block 1007.

The function of blocks 1007, 1008, and 1009 can be performed also with a forward trace from the driver to the ends of the branches of the signal path, the trace then returning backwards, accumulating the capacitance, and assigning the capacitance to vias as encountered in the backwards trace. Such signal forward and backward traces are common in design automation systems.

Block 1010 determines if this is the last signal to be considered; if so, control passes to block 1011; if not, control passes to block 1002.

Block 1011 is simply a connector to block 1051 on FIG. 10*b*.

Block 1052 on FIG. 10*b* begins the creation of redundant vias.

Block 1053 begins a loop wherein each single via on the chip is considered for replacement by a redundant via. Each time block 1053 is entered, a different single via is selected for consideration. As stated above, there is no reason to consider already existing redundant vias for creation of additional redundancy.

Block 1054, similar to block 953 on FIG. 9*b*, checks if the instant via is on a candidate net; if not, control is passed to block 1060; if so, control is passed to block 1055. As with the discussion for block 953, block 1054 could optionally incorporate the determination of candidate nets that is accomplished, in FIG. 10*b*, by blocks 1003, 1004, 1005, and 1006.

Block 1055, similar to block 955 on FIG. 9*b*, determines if space exists to replace the instant single via with a redundant via; if not, control is passed to block 1060; if so, control is passed to block 1056.

Block 1056 checks whether there is another single via that will compete for the space; if not, control passes to block 1059; if so, control passes to block 1057.

Block 1057 determines whether the competing single via is on a candidate signal; if not, control passes to block 1059; if so, control passes to block 1058.

Block 1058 compares the capacitance value associated with the instant via in block 1008 with the capacitance value associated with the competing via. If the instant via has equal or greater capacitance, control is passed to block 1059; if not, control is passed to block 1060. As discussed in block 957, priority is granted to the instant via rather than the competing via in the "equal" case only to simplify the process.

Block 1059 creates a redundant via to replace the instant single via. Space taken by the redundant via is made unavailable for further consideration for creation of redundant vias.

Block 1060 determines if the instant single via is the last via to consider; if not, control passes to block 1053; if so, control passes to block 1061, which completes the processing.

Figure 12:
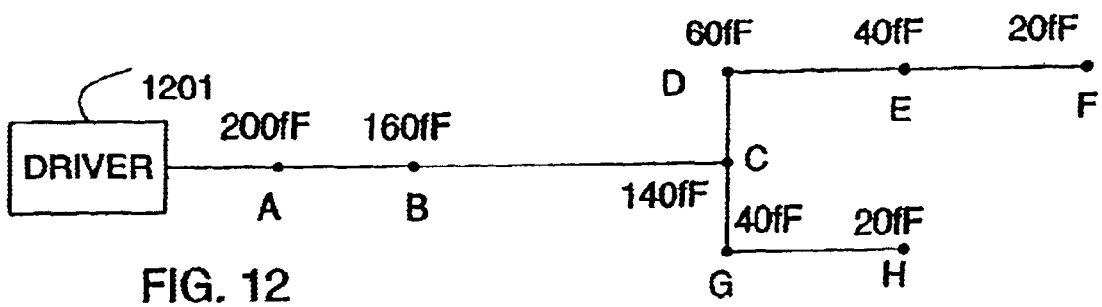
FIG. 12 shows a schematic of a driver and a signal network, with an example of via capacitance value assignments as taught by the method of FIG. 10a and FIG. 10b.

FIG. 12 depicts a schematic of a driver and a signal path, with the vias assigned capacitance values according to the method detailed in FIG. 10*a* and FIG. 10*b*. Driver 1201 drives the signal. Via F has a 20 femtofarad (fF) capacitance associated with it. Via F is at the end of a branch of the signal, and therefore only has a small amount of capacitance that must be charged through the via, perhaps only a receiver input capacitance, and a small amount of parasitic wiring capacitance. Via E has a 40 fF capacitance associated with it. It must carry the same capacitive charging current as via F, and must also charge whatever capacitance occurs between via E and via F. Via D has even more capacitance, 60 fF, having further added whatever capacitance occurs between via D and Via E. Similarly, vias H, G, C, B, and A receive values equal to the amount of capacitance that must be charged by current flowing through those vias. Using the simple delay algorithm used before, a 1000-ohm defect in via F would result in only 20 picoseconds of unexpected delay. A 1000-ohm defect in via A, however, would result in a 200 picosecond delay anomaly. This example clearly shows that vias assigned large capacitive values should be given redundant via priority over vias that have been assigned small capacitive values.

The exemplary values of capacitance in FIG. 12 are typical, although some signals may be much longer, or may be loaded with many more inputs, with much larger capacitances therefore assigned. Some signals may be much shorter, with smaller capacitances therefore assigned.

In general, the routines executed to implement the embodiments of the invention, whether implemented as part of an operating system or a specific application, component, program, object, module, or sequence of instructions, will be referred to herein as "computer program", or simply "programs". The computer programs typically comprise one or more instructions that are resident at various times in various memory and storage devices in a computer, and that, when read and executed by one or more processors in a computer, cause that computer to perform the steps necessary to execute steps or elements embodying the various aspects of the invention.

Moreover, while the invention has and hereinafter will be described in the context of fully functioning computers and other programmable electronic devices, those skilled in the art will appreciate that the various embodiments of the invention are capable of being distributed as a program product in a variety of forms, and that the invention applies equally regardless of the particular type of data/signal bearing media used to actually carry out the distribution. Examples of data/signal bearing media include but are not limited to recordable type media such as volatile and non-volatile memory devices, floppy and other removable disks, hard disk drives, magnetic tape, optical disks (e.g., CD-ROM's, DVD's, etc.), among others, and transmission type media such as digital and analog communication links.

While the present invention has been described with reference to the details of the embodiments of the invention shown in the drawings, these details are not intended to limit the scope of the invention as claimed in the appended claims.

What is claimed is:

1. A program product, which, when executed by a processor, performs a method for replacement of single vias by redundant vias on a semiconductor chip, comprising the steps of:

- determining a value for each single via on said chip indicative of a magnitude of a delay anomaly resultant from a resistive defect in said single via;
- replacing each single via with a redundant via if wiring area is available and no other single via contends for said area;
- comparing said value for each contending single via in a plurality of contending single vias in an area of contention where no more than one redundant via can be created; and
- replacing with a redundant via the contending single via in the plurality of contending single vias in the area of contention for which said value indicates the largest said delay anomaly would be caused by a resistive defect in said single via.

2. The program product of claim 1, wherein the method further comprises the step of removing all single vias on clock signals from consideration for replacement with redundant vias.

3. The program product of claim 1, wherein the method further comprises the steps of:

- computing delays and timing margins for each signal on said chip; and
- removing all single vias on signals having less than a predetermined amount of timing margin from consideration for replacement with redundant vias.

4. The program product of claim 1, wherein the step of determining said value further comprises the steps of:

- determining for each single via an amount of capacitance which must be charged or discharged by current flowing through said single via; and
- assigning said amount, or a quantity indicative of said amount, to said value.

5. The program product of claim 1, wherein the step of determining said value comprises the steps of:

- traversing each signal wire, starting at a driver on said wire;
- incrementing a counter each time a single via is traversed in a direction traveling away from said driver; and
- assigning the counter, or a quantity proportional to said counter, to said value for each single via as said wire is traversed.

6. The program product of claim 1, wherein the step of determining said value further comprises the steps of:

- tracing each signal wire backwards from each receiver on said signal wire;
- counting the total number of all vias traversed from all receivers on said wire to each instant single via, including vias traversed on all branches of said signal wire from all receivers to said instant single via; and
- assigning said count, or a number proportional to said count, to said value for each single via.

* * * * *